United States Patent
Yang

(10) Patent No.: US 7,206,202 B2
(45) Date of Patent: Apr. 17, 2007

(54) ELECTRONIC APPARATUS WITH HEAT-DISSIPATING STRUCTURE

(75) Inventor: I-Jung Yang, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 246 days.

(21) Appl. No.: 11/071,551

(22) Filed: Mar. 3, 2005

(65) Prior Publication Data

US 2005/0254216 A1 Nov. 17, 2005

(30) Foreign Application Priority Data

May 13, 2004 (TW) ................................ 93113456 A

(51) Int. Cl.
*H05K 7/20* (2006.01)
(52) U.S. Cl. ............ 361/690; 361/695; 361/704; 257/721; 174/16.1; 165/80.2
(58) Field of Classification Search ............ None
See application file for complete search history.

(56) References Cited

U.S. PATENT DOCUMENTS

| | | | | |
|---|---|---|---|---|
| 5,543,662 A | * | 8/1996 | Burward-Hoy | 257/716 |
| 5,773,755 A | * | 6/1998 | Iwatare | 174/17 VA |
| 5,894,407 A | * | 4/1999 | Aakalu et al. | 361/695 |
| 6,128,188 A | * | 10/2000 | Hanners | 361/694 |
| 6,278,607 B1 | * | 8/2001 | Moore et al. | 361/687 |
| 6,330,157 B1 | * | 12/2001 | Bezama et al. | 361/704 |
| 2005/0213304 A1 | * | 9/2005 | Exel et al. | 361/713 |

* cited by examiner

*Primary Examiner*—Boris Chérvinsky

(57) ABSTRACT

An electronic apparatus with a heat-dissipating structure is disclosed. The electronic apparatus with a heat-dissipating structure comprises a main body having a plurality of apertures, a resilient component having two ends fixed to the main body, and an insulation component disposed between the main body and the resilient component, connected with the resilient component and covering the surface of the apertures. When the temperature of the electronic apparatus is increased, the resilient component expands and bends outward so as to carry the insulation component apart from the surface of the apertures and further form a space, thereby enabling air to flow through the apertures of the electronic apparatus and the space to dissipate heat of the electronic apparatus.

20 Claims, 9 Drawing Sheets

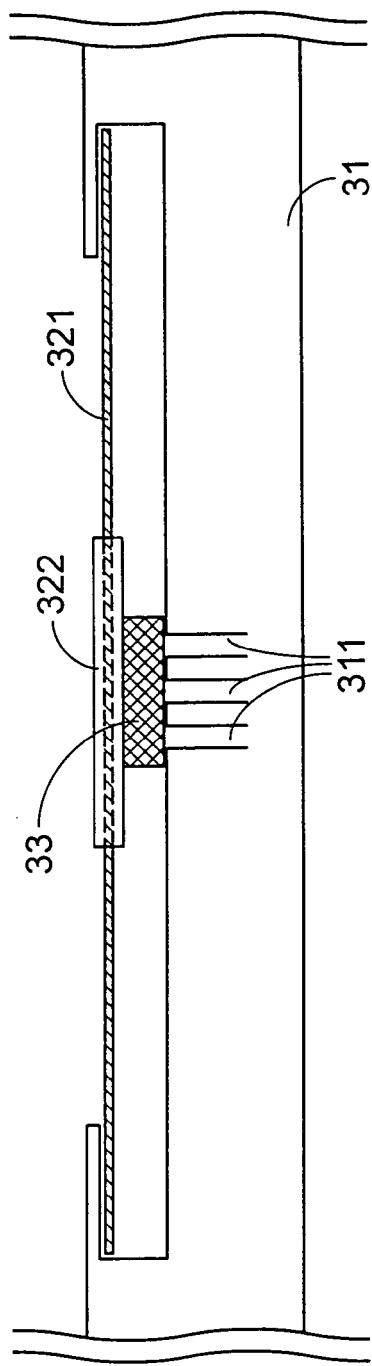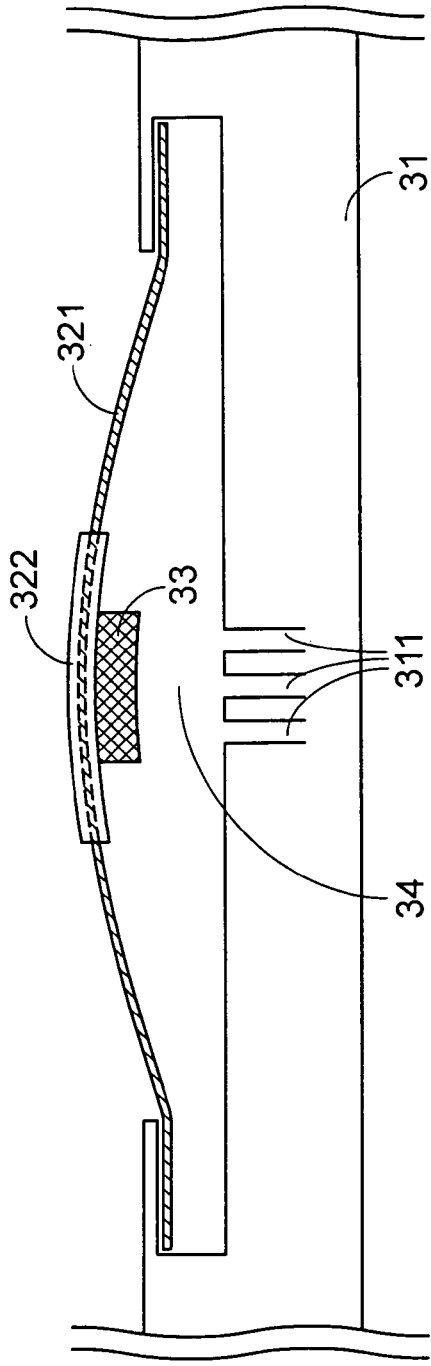

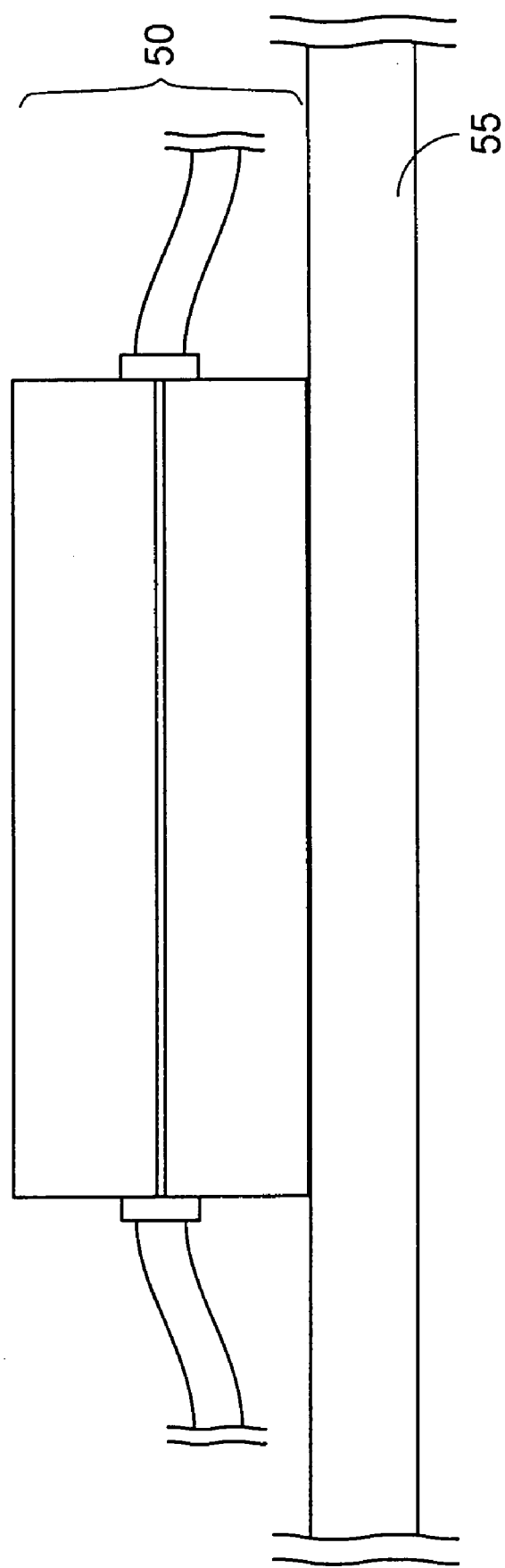

ELECTRONIC APPARATUS WITH HEAT-DISSIPATING STRUCTURE

FIELD OF THE INVENTION

The present invention relates to an electronic apparatus and particularly to an electronic apparatus with a heat-dissipating structure.

BACKGROUND OF THE INVENTION

Portable electronic products or other electronic information products, such as personal portable computers, personal digital assistants, or digital voice recorders, and so on, have gradually become electronic products which are frequently used by people in daily life. Because users need to often bring these electronic products with themselves and maintain available power any time, an adaptor or a charger becomes a necessary additional equipment.

Please refer to FIG. 1, which is a schematic view showing an adaptor used in a portable computer according to the prior art. As shown in FIG. 1, a portable computer 10 possesses an external power-receiving inlet 101 used to be electrically connected with an output plug 111 of an adaptor 11, and the other end of the adaptor 11 possesses an alternating current (AC) plug used to be plugged into an external AC socket. The adaptor 11 will convert the AC voltage signal from the commercially available power into the direct current (DC) voltage signal required by the operation of the portable computer 10.

As known, partial electric power will be consumed during the operation of an adaptor; however, with the development of techniques of the electronic products and in order to satisfy the demand of users, the number of the electronic elements loaded on the printed circuit board in the electronic product is increasing and the integration of the electronic elements is also increasing, and therefore, the required electric power of most adapters has been increased to 100~200 watt or even over 200 watt. With the increasing number of the consumed watt during the operation of the adaptor, a lot of heat energy will be produced, which results in the temperature increase of the entire adaptor.

Please refer to FIG. 1 again. It can be understood from FIG. 1 that the whole circuit of the conventional adaptor is disposed inside a square and airtight case, and the plenty of heat energy produced during the operation of the adaptor cannot be dissipated from the interior to the exterior of the adaptor, such that the interior of the adaptor will be overheated. As a result, the adaptor may break down due to the overheated situation, or the electric leakage may be occurred, and thus the breakdown rate of the electronic product will be increased, or the life span of the electronic product will be reduced, and what is more serious is that a fire accident may take place. Hence, the heat-dissipating problem of the adaptor cannot be continuously ignored.

Therefore, it is needed to develop an electronic apparatus with a heat-dissipating structure to solve the aforesaid problems.

SUMMARY OF THE INVENTION

It is an object of the present invention to provide an electronic apparatus with a heat-dissipating structure to overcome the defects of the conventional adaptor resulted from the overheated situation or the occurrence of the electric leakage.

In accordance with an aspect of the present invention, an electronic apparatus with a heat-dissipating structure comprises a main body having a plurality of apertures, a resilient component having two ends fixed to the main body, and an insulation component disposed between the main body and the resilient component, connected with the resilient component and covering the surface of the apertures. When the temperature of the electronic apparatus is increased, the resilient component expands and bends outward so as to carry the insulation component apart from the surface of the apertures and further form a space, thereby enabling air to flow through the apertures of the electronic apparatus and the space to dissipate heat of the electronic apparatus.

In an embodiment, the electronic apparatus is an adaptor, for example, an AC/DC adaptor used to convert an AC voltage signal into a DC voltage signal.

In an embodiment, the resilient component is made of a material having a characteristic of thermal expansion and cold contraction. For example, the resilient component is a rubber pad, and the insulation component and the resilient component are formed integrally.

In an embodiment, the resilient component comprises a metal piece with a high expansion coefficient and an insulating protective cover.

Certainly, the thermal conduction coefficient of the resilient component is larger than that of the main body.

In addition, the insulation component covering the surface of the apertures prevents electric leakage of the main body.

In accordance with an aspect of the present invention, an electronic apparatus with a heat-dissipating structure comprises a main body having a plurality of apertures and a plurality of fixing portions, a resilient component having two ends fixed to the fixing portions of the main body, and an insulation component disposed between the main body and the resilient component, connected with the resilient component and covering the surface of the apertures. When the temperature of the electronic apparatus is increased, the center of the resilient component expands so as to carry the insulation component apart from the surface of the apertures and further form a space, thereby enabling air to flow through the apertures of the electronic apparatus and the space to dissipate heat of the electronic apparatus.

The present invention needs not be limited to the above embodiment. The above objects and advantages of the present invention will become more readily apparent to those ordinarily skilled in the art after reviewing the following detailed description and accompanying drawings, in which:

BRIEF DESCRIPTION OF THE DRAWINGS

FIG. 3(b) is a cross-sectional view of the adaptor shown in FIG. 3(a);

FIG. 3(c) shows the resilient component of the adaptor shown in FIG. 3(b) expands when heated;

FIG. 5(a) is a schematic view showing the adaptor with the heat-dissipating structure according to the present invention which is placed on a surface.

DETAILED DESCRIPTION OF THE PREFERRED EMBODIMENTS

The present invention relates to an electronic apparatus with a heat-dissipating structure. Although an adaptor with a heat-dissipating structure is demonstrated in the following embodiments to illustrate the present techniques, the electronic apparatus that is applicable to the present techniques is not limited to the adapter. Any electronic apparatus that is applicable to the following techniques can be incorporated herein for reference.

Figure 1:
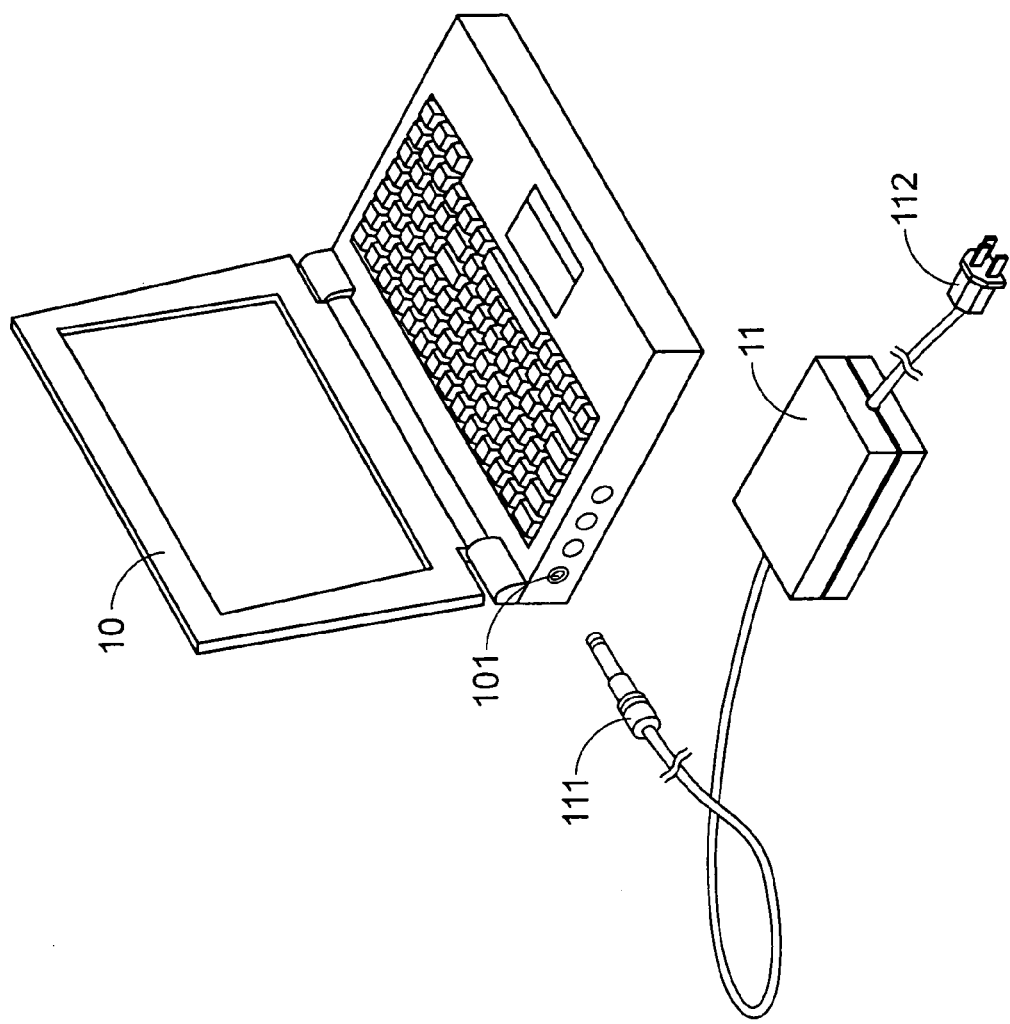
FIG. 1 is a schematic view showing an adaptor used in a portable computer according to the prior art.
Figure 2A:
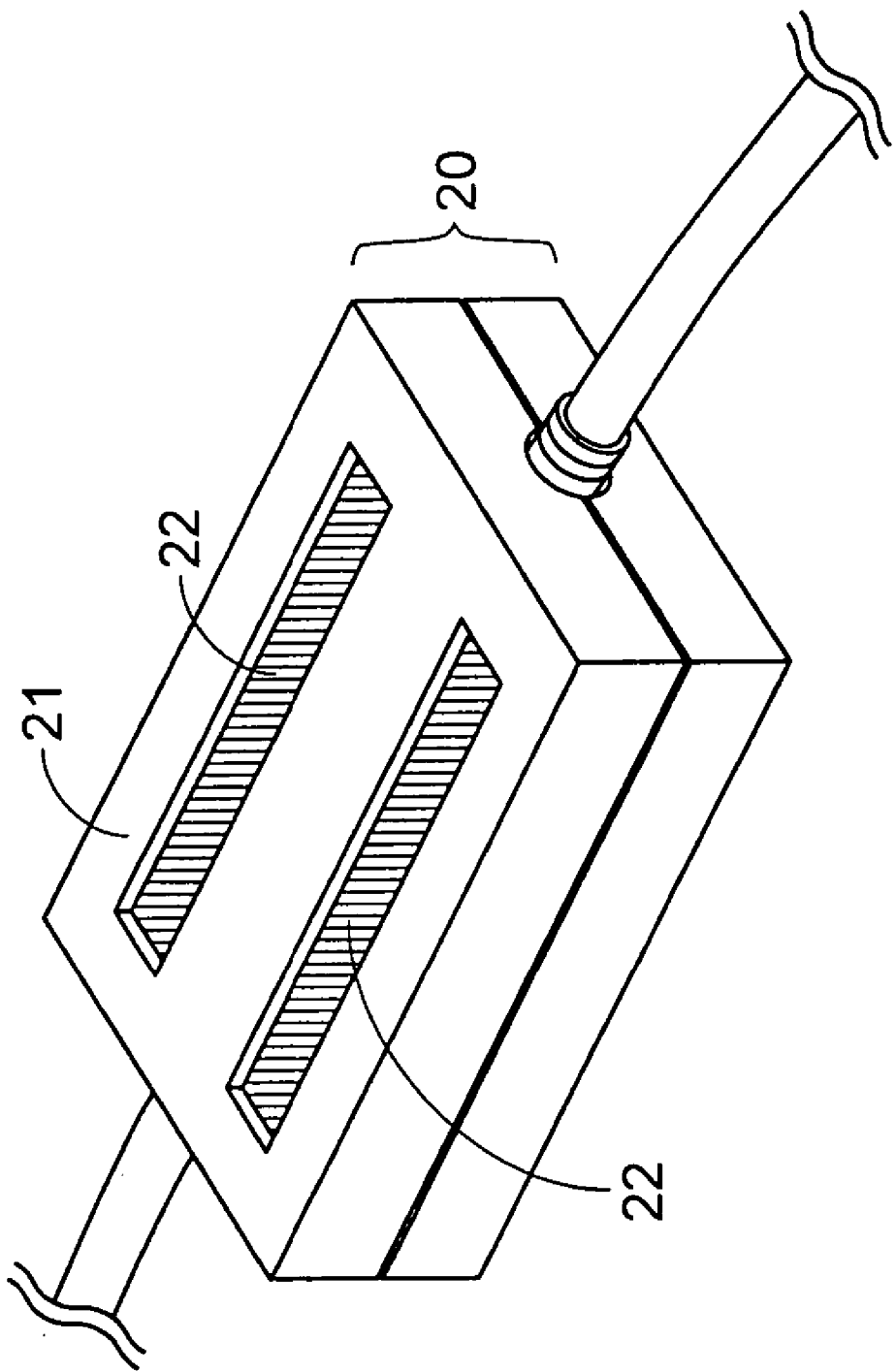
FIG. 2(a) is a schematic view showing the adaptor according to a first preferred embodiment of the present invention.
Figure 2B:
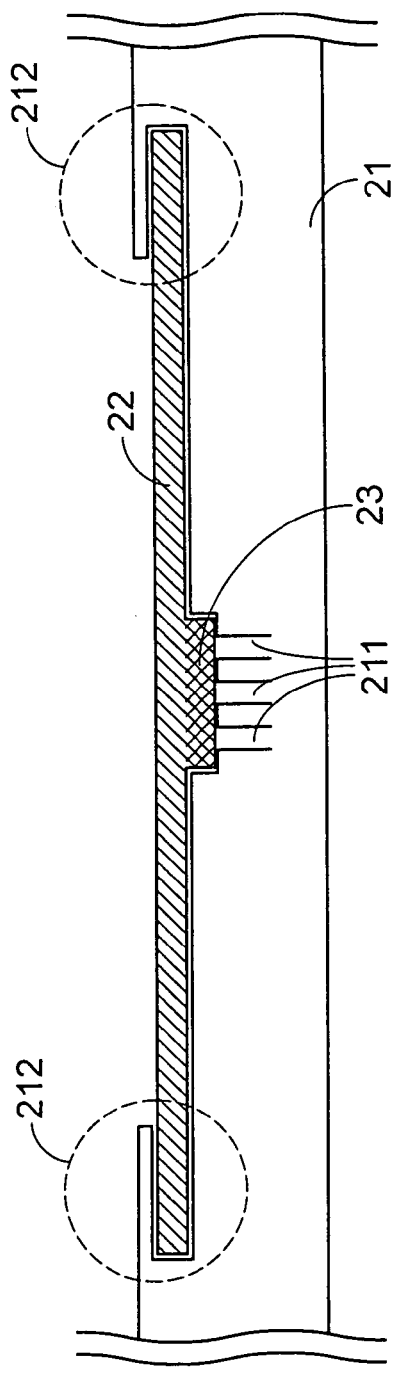
FIG. 2(b) is a cross-sectional view of the adaptor shown in FIG. 2(a)

Please refer to FIG. 2(a), which is a schematic view showing the adaptor according to the first preferred embodiment of the present invention. As shown in FIG. 2(a), the adaptor 20 of the present invention is an AC/DC adaptor used to convert the AC voltage signal from the commercially available power into the DC voltage signal required by the operation of an electronic product (not shown). Please further refer to FIGS. 2(a) and 2(b), the adaptor 20 of the present invention comprises a main body 21, a resilient component 22, and an insulation component 23. Of course, the above-mentioned resilient component 22 and insulation component 23 with heat-dissipating function can be disposed on any side of the adaptor 20 according to the design requirement of the user and can be disposed on plural sides of the adaptor 20 in order to reinforce the heat-dissipating effect.

The main body 21 possesses a plurality of apertures 211 and a plurality of fixing portions 212. The apertures 211 provide heat-dissipating routes for the main body 21 to dissipate the heat generated from the electronic elements in the main body 21 during operation. The fixing portions 212 can be trench structures for inserting the two ends of the resilient component 22 therein so as to fix the resilient component 22 to the main body 21. Of course, the two ends of the resilient component 22 can be fixed to the main body 21 by any kind of methods, such as engagement, adhesion or locking. Because these fixing methods are well known, they are not redundantly described here.

The resilient component 22 can be made of a material possessing a characteristic of thermal expansion and cold contraction and a characteristic of anti-electric conduction. In an embodiment of the present invention, a rubber pad, which expands when heated and contracts when cooled, is used as the resilient component 22.

The insulation component 23 is disposed between the main body 21 and the resilient component 22 and in the position corresponding to the apertures 211 of the main body 21, and is connected with the resilient component 22. In this embodiment, the insulation component 23 and the resilient component 22 are formed integrally (i.e. same rubber material), and the insulation component 23 is disposed on the inner side of the resilient component 22 and used to cover the surface of the apertures 211 to prevent electric leakage through the apertures 211 of the main body 21.

Figure 2C:
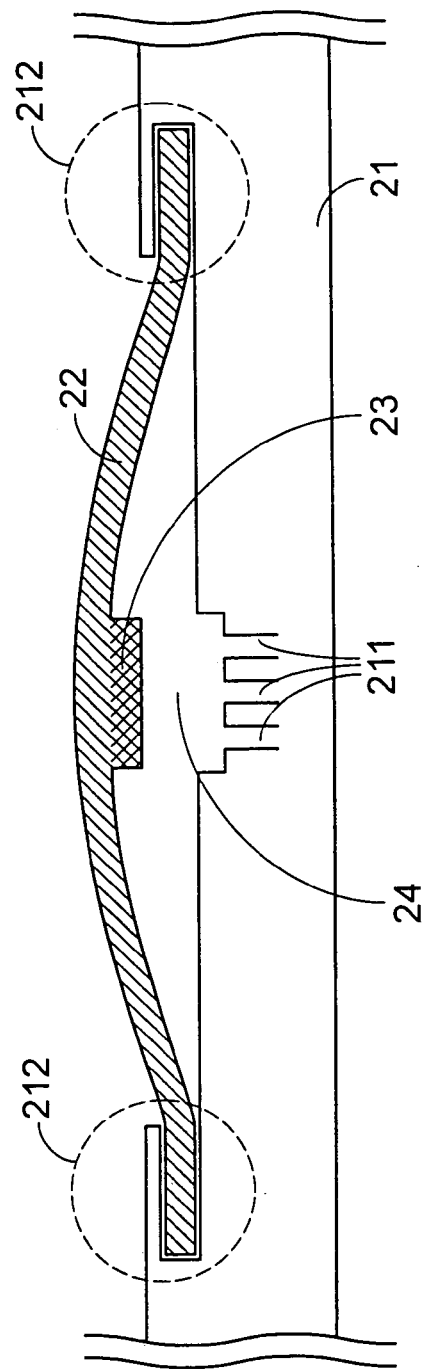
FIG. 2(c) shows the resilient component of the adaptor shown in FIG. 2(b) expands when heated.

The thermal conduction coefficient of the resilient component 22 must be larger than that of the main body 21. When the temperature of the main body 21 is increased due to the operation of the electronic elements of the adaptor 20, the resilient component 22 will expand and bend outward when heated, and carry the insulation component 23 apart from the surface of the apertures 211. Accordingly, a space 24 for heat-dissipation is formed between the main body 21 and the resilient component 22 (as shown in FIG. 2(c)), and thus, the air can flow through the apertures 211 and the space 24 to dissipate the heat produced during the operation of the electronic elements in the main body 21 of the electronic apparatus.

Figure 3A:
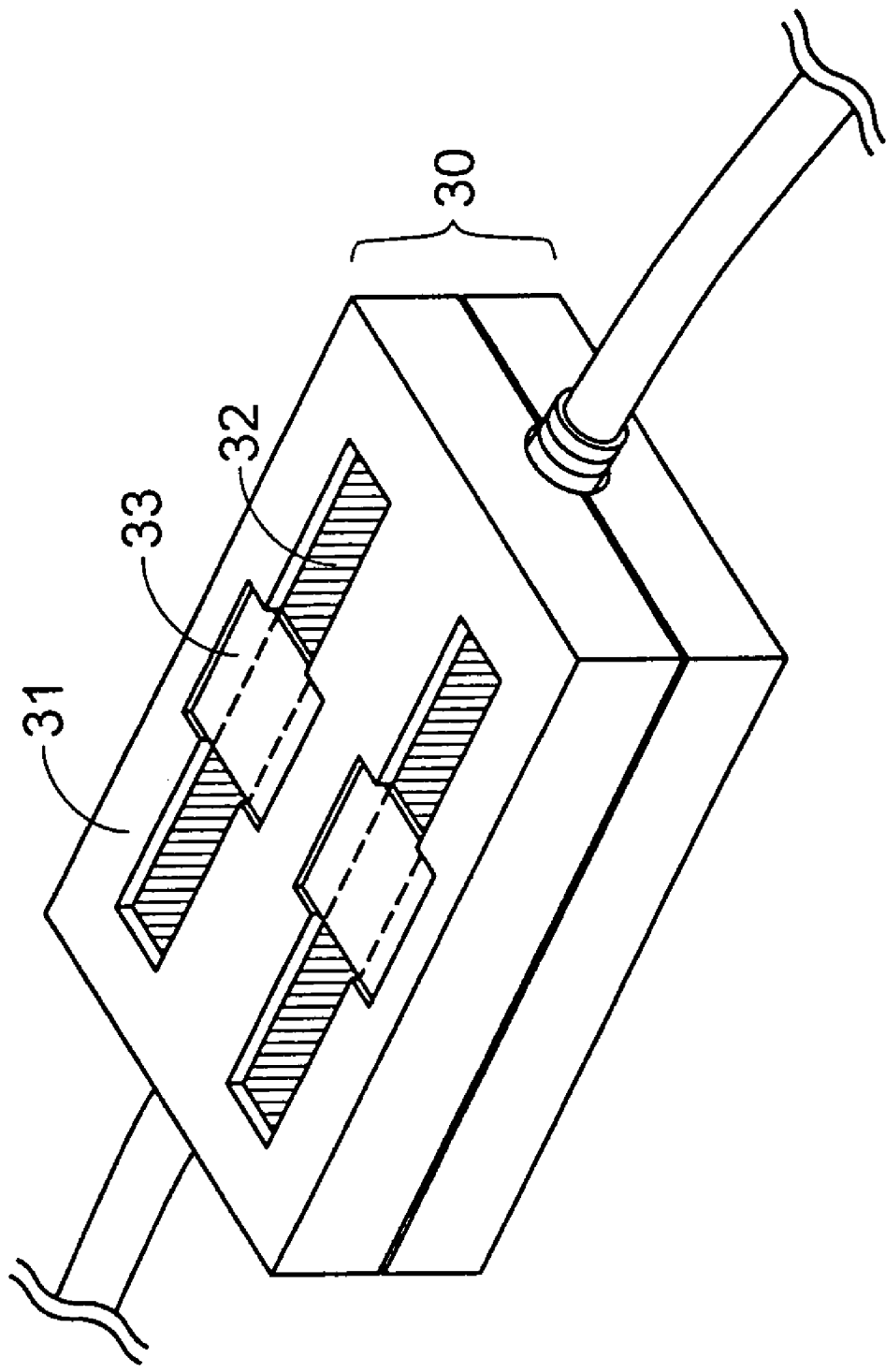
FIG. 3(a) is a schematic view showing the adaptor according to a second preferred embodiment of the present invention.

Please refer to FIGS. 3(a) and 3(b), which are three-dimensional and cross-sectional views showing the adaptor according to the second preferred embodiment of the present invention. In this embodiment, the resilient component 32 comprises a metal piece 321 and an insulating protective cover 322. The metal piece 321 has a high expansion coefficient and will expand and bend fast when heated, so the heat produced during the operation of the electronic elements in the main body 31 of the adaptor 30 can be dissipated in a short time. Furthermore, the insulating protective cover 322 is a hollow structure that can sleeve a part of the metal piece 321 therein so as to prevent electric leakage.

The insulation component 33 is connected to the inner side of the insulating protective cover 322 and disposed in the position corresponding to the apertures 311 of the main body 31. When the metal piece 321 does not expand by heat, the insulation component 33 covers the surface of the apertures 311 to prevent the occurrence of the electric leakage of the main body 31 through the apertures 311. When the metal piece 321 expands and bends as overheated, the insulating protective cover 322 and the insulation component 33 are raised up along with the metal piece 321 and apart from the surface of the apertures 211. Accordingly, a space 34 for heat-dissipation is formed between the main body 31 and the resilient component 32 (as shown in FIG. 3(c)), and thus, the apertures 311 of the main body 31 are open to the external environment and the heat of the electronic apparatus can be dissipated by the airflow flowing through the apertures 311 and the space 34.

In contrast, when the temperature of the resilient component 32 is lowered, the resilient component 32 contracts and the insulation component 33 is drawn back to cover the surface of the apertures 311 again, so as to prevent the occurrence of the electric leakage of the main body 31 through the apertures 311.

Certainly, in this embodiment, the resilient component 32 and the insulation component 33 can also be disposed on any side of the adaptor 30 according to the design requirement and can be disposed on plural sides of the adaptor 30 in order to reinforce the heat-dissipating effect. Moreover, the insulation component 33 can be made of rubber or acrylic material but not confined thereto.

Figure 4A:
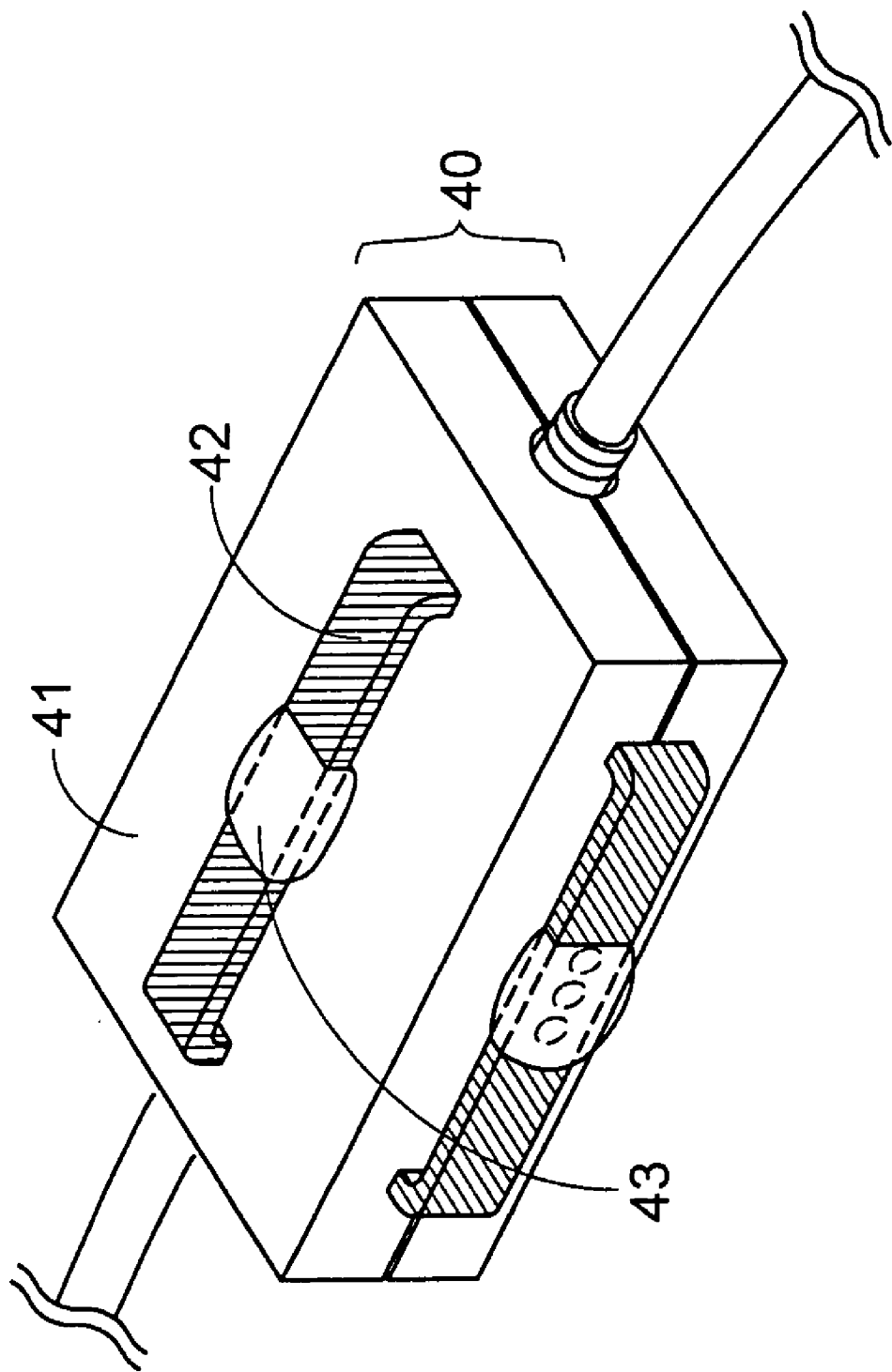
FIG. 4(a) is a schematic view showing the adaptor according to a third preferred embodiment of the present invention.
Figure 4B:
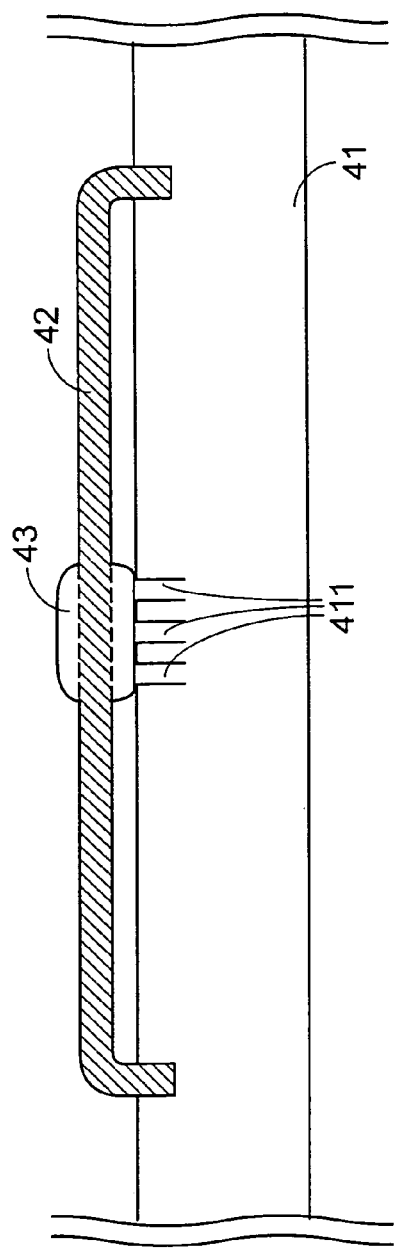
FIG. 4(b) is a cross-sectional view of the adaptor shown in FIG. 4(a)

Please further refer to FIGS. 4(a) and 4(b), which are three-dimensional and cross-sectional views showing the adaptor according to the third preferred embodiment of the present invention. In this embodiment, the heat-dissipating structures are disposed separately on two different sides of the adaptor 40 to enhance the heat-dissipating effect. The insulation component 43 is an adhesive piece adhering to the resilient component 42 in an entwining way, and the adhering position is corresponding to the apertures 411 of the main body 41 and used to cover the surface of the apertures 411 to prevent the occurrence of the electric leakage of the main body 41 through the apertures 411.

Figure 4C:
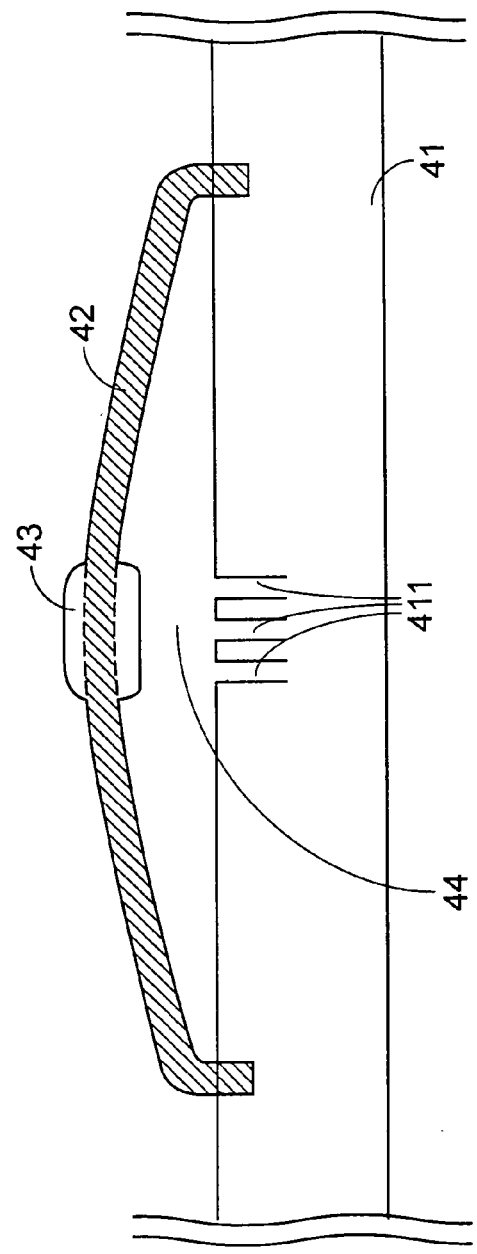
FIG. 4(c) shows the resilient component of the adaptor shown in FIG. 4(b) expands when heated.

In addition, the two ends of the resilient component 42 can be inserted into the interior of the main body 41 by any kind of methods such as engagement, adhesion or locking. When the temperature of the main body 41 is increased, the center portion of the resilient component 42 will expand toward a particular direction because the two ends of the resilient component 42 are fixed in the interior of the main body 41. Therefore, the resilient component 42 will expand and bend from a planar state to an arc state, and carry the insulation component 43 apart from the surface of the apertures 411. Accordingly, a space 44 for heat-dissipation is formed between the main body 41 and the resilient component 42 (as shown in FIG. 4(c)), and thus, the air can flow through the apertures 411 and the space 44 to dissipate the heat produced during the operation of the electronic elements in the main body 41 of the electronic apparatus.

Figure 5B:
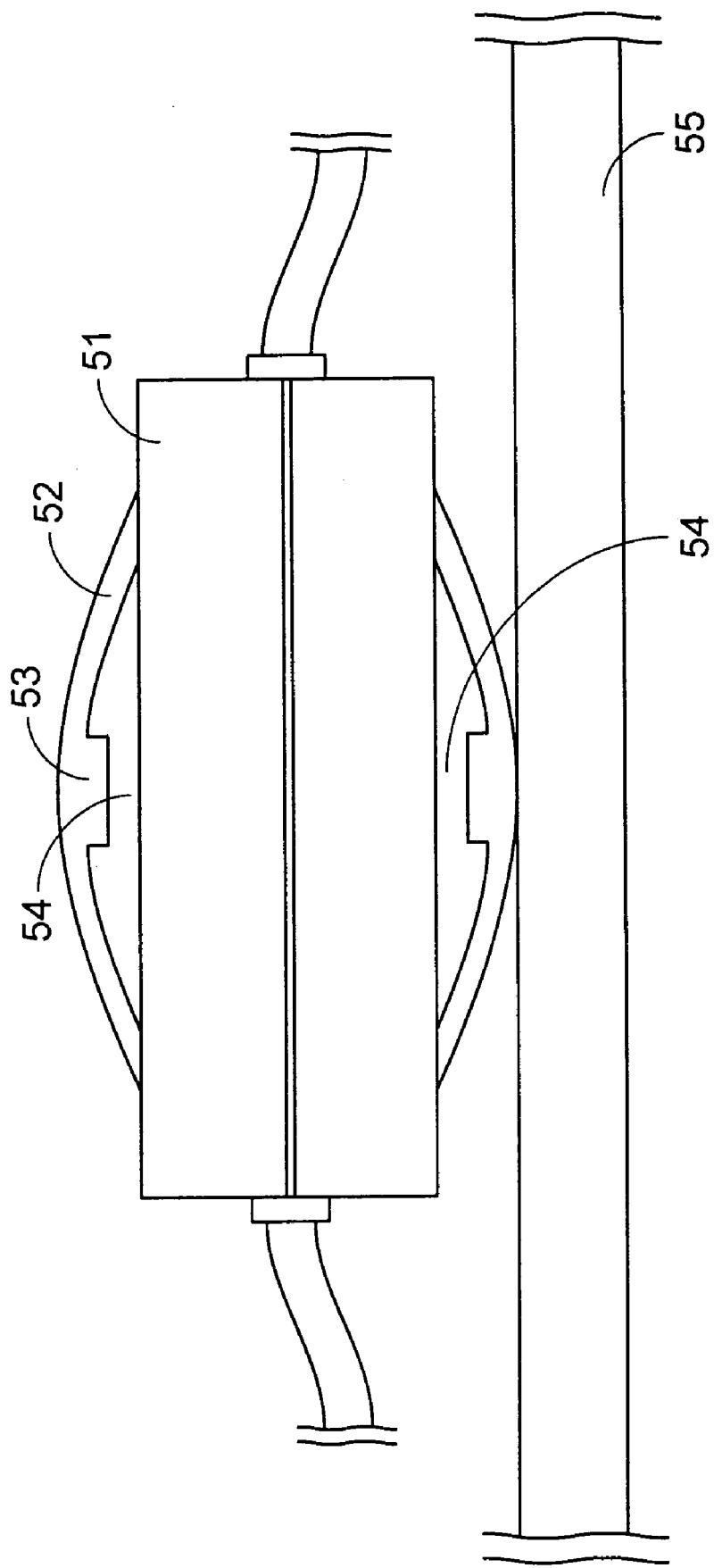
FIG. 5(b) shows the resilient components of the adaptor shown in FIG. 5(a) expand when heated.

Please further refer to FIGS. 5(a) and 5(b), which are schematic views showing the adaptor with the heat-dissipating structure according to the present invention which is placed on a surface. As shown in FIGS. 5(a) and 5(b), when the adaptor 50 is not overheated, it is normally placed on the surface 55, such as the surface of desk or floor, as well as the conventional adaptor. When the adaptor 50 is operated and the temperature thereof is gradually increased, the resilient component 52 starts to expand and bend, and the insulation component 53 originally covering the apertures will be raised up along with the resilient component 53 and apart from the surface of the apertures; thereby a space 54 for heat-dissipation is formed between the main body 51 and the resilient component 52. Because the upper and lower sides of the main body 51 both possess resilient components 52 (as shown in FIG. 5(b)), the apertures on the upper and lower sides of the main body 51 are open to the external air, and thus result in the convection effect. Therefore, through the flow of the air, the heat produced during the operation of the adaptor 50 can be gradually dissipated by the air, so the purpose of heat-dissipation can be achieved, and the drawbacks resulted from the overheated adaptor 50 can be prevented.

In conclusion, according to the electronic apparatus with the heat-dissipating structure of the present invention, when the temperature of the electronic apparatus is increased, the resilient component possessing a characteristic of thermal expansion and cold contraction will bend outward together with the insulation component originally covering the apertures; thereby a space for heat-dissipation is formed between the main body and the resilient component, so as to rapidly dissipate the heat produced during the operation of the electronic elements in the main body via the airflow. As a result, the defects of the conventional adaptor resulted from the overheated situation or the occurrence of the electric leakage can be overcome. Therefore, the present invention possesses high industrial value.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An electronic apparatus with a heat-dissipating structure, comprising:

a main body having a plurality of apertures;

a resilient component having two ends fixed to said main body; and an insulation component disposed between said main body and said resilient component, connected with said resilient component and covering the surface of said apertures;

wherein when the temperature of said electronic apparatus is increased, said resilient component expands and bends outward so as to carry said insulation component apart from said surface of said apertures and further form a space, thereby enabling air to flow through said apertures of said electronic apparatus and said space to dissipate heat of said electronic apparatus.

2. The electronic apparatus according to claim 1 wherein said electronic apparatus is an adaptor.

3. The electronic apparatus according to claim 2 wherein said adaptor is an AC/DC adaptor used to convert an AC voltage signal into a DC voltage signal.

4. The electronic apparatus according to claim 1 wherein said resilient component is made of a material having a characteristic of thermal expansion and cold contraction.

5. The electronic apparatus according to claim 4 wherein said resilient component is a rubber pad.

6. The electronic apparatus according to claim 5 wherein said insulation component and said resilient component are formed integrally.

7. The electronic apparatus according to claim 4 wherein said resilient component comprises a metal piece with a high expansion coefficient and an insulating protective cover.

8. The electronic apparatus according to claim 1 wherein the thermal conduction coefficient of said resilient component is larger than that of said main body.

9. The electronic apparatus according to claim 1 wherein said insulation component covering said surface of said apertures prevents electric leakage of said main body.

10. The electronic apparatus according to claim 1 wherein said insulation component is an adhesive piece entwining on said resilient component in a position corresponding to said apertures.

11. An electronic apparatus with a heat-dissipating structure, comprising:

a main body having a plurality of apertures and a plurality of fixing portions;

a resilient component having two ends fixed to said fixing portions of said main body; and an insulation component disposed between said main body and said resilient component, connected with said resilient component and covering the surface of said apertures;

wherein when the temperature of said electronic apparatus is increased, the center of said resilient component expands so as to carry said insulation component apart from said surface of said apertures and further form a space, thereby enabling air to flow through said apertures of said electronic apparatus and said space to dissipate heat of said electronic apparatus.

12. The electronic apparatus according to claim 11 wherein said electronic apparatus is an adaptor.

13. The electronic apparatus according to claim 12 wherein said adaptor is an AC/DC adaptor used to convert an AC voltage signal into a DC voltage signal.

14. The electronic apparatus according to claim 11 wherein said resilient component is made of a material having a characteristic of thermal expansion and cold contraction.

15. The electronic apparatus according to claim 14 wherein said resilient component is a rubber pad.

16. The electronic apparatus according to claim 15 wherein said insulation component and said resilient component are formed integrally.

17. The electronic apparatus according to claim 14 wherein said resilient component comprises a metal piece with a high expansion coefficient and an insulating protective cover.

18. The electronic apparatus according to claim 11 wherein the thermal conduction coefficient of said resilient component is larger than that of said main body.

19. The electronic apparatus according to claim 11 wherein said insulation component covering said surface of said apertures prevents electric leakage of said main body.

20. The electronic apparatus according to claim 11 wherein said insulation component is an adhesive piece entwining on said resilient component in a position corresponding to said apertures.

* * * * *